United States Patent [19]

Chang et al.

[11] Patent Number: 5,393,359
[45] Date of Patent: Feb. 28, 1995

[54] METHOD AND APPARATUS FOR BONDING OUTER LEADS OF A LIQUID CRYSTAL DISPLAY TO METAL LEADS OF A BONDING TAPE

[75] Inventors: San-Wen Chang, Hsinchu; Pao-Yun Tang, Chungli; Shyuan-Jeng Ho, Hsinchu, all of Taiwan, Prov. of China

[73] Assignee: Industrial Technology Research Institute, Hsinchu, Taiwan, Prov. of China

[21] Appl. No.: 104,011

[22] Filed: Aug. 10, 1993

[51] Int. Cl.⁶ ............................................. B32B 31/00
[52] U.S. Cl. ....................... 156/64; 156/247; 156/378; 359/50; 359/82; 359/83
[58] Field of Search .................. 359/48, 50, 82, 83, 359/88, 89; 156/247, 378, 499, 64

[56] References Cited

U.S. PATENT DOCUMENTS

| | | | |
|---|---|---|---|
| 4,469,553 | 9/1984 | Whitehead | 156/378 X |
| 4,731,282 | 3/1988 | Tsukagoshi et al. | 428/220 |
| 5,056,296 | 10/1991 | Ross et al. | 156/499 X |
| 5,063,538 | 11/1991 | Kuehnle | 365/106 |
| 5,074,035 | 12/1991 | Tyznik | 156/247 X |

*Primary Examiner*—David A. Simmons
*Assistant Examiner*—Paul M. Rivard
*Attorney, Agent, or Firm*—George O. Saile

[57] ABSTRACT

There is shown an apparatus for bonding outer leads of a display panel to metal leads of a bonding tape that includes a movable stage for supporting the display panel. A light source is provided on the stage that is positioned beneath the outer leads of the panel, when mounted on the stage. A means is provided to support the bonding tape so that the metal leads are held in overlapping position over the outer leads. A means to observe the resultant overlapped leads is located over the light source. A heat source for applying heat to the aligned leads to form bonds therebetween is provided.

18 Claims, 3 Drawing Sheets

METHOD AND APPARATUS FOR BONDING OUTER LEADS OF A LIQUID CRYSTAL DISPLAY TO METAL LEADS OF A BONDING TAPE

BACKGROUND OF THE INVENTION

1. Field of the Invention

The present invention relates to electrical lead bonding, more particularly to the method and apparatus for bonding outer leads of a display panel to metal leads on bonding tape.

2. Description of the Prior Art

Tape automated bonding of semiconductor lead bonding to a supporting circuit board is well known. In this application the leads on the semiconductor device and the bonding tape are opaque and can be clearly seen by suitable apparatus when viewed from above the device. However, liquid crystal display (LCD) panels utilize transparent leads, such as tin oxide or the like, which are more difficult to see for alignment.

FIG. 1 shows a typical apparatus for bonding tape leads to LCD panel displays wherein alignment is very difficult. There are two kinds of light sources under the bonding stage 10. One is coaxial light from the charge coupled device (CCD) cameras 22 and the other is a normal light source 15. The coaxial light source in the CCD camera 22 is designed to see the indium tin oxide (ITO) alignment mark on the LCD panel 12. The normal light sources 15 on both sides of the CCD cameras 22 are designed to see the copper alignment mark on the polyimide tape carrier. The process flow of the outer lead bonding (OLB) operations on this conventional bonder is as follows. After temporary bonding of anisotropic conductive film (ACF), the back-paper film on the ACF is removed. The next step is alignment of the ITO pattern and the copper lead pattern. The coaxial light can see the square alignment marks of LCD panel on the monitor and the auto-alignment system will mark the positions. The coaxial light then is turned off and the normal light turned on. The alignment marks on the copper lead pattern then show up and auto-alignment system checks the position of marks differences and then makes an adjustment. When the differences are under control, the bonding step is performed. The process concept is good, but in the execution there are problems because of the opaqueness of the leads as described above.

SUMMARY OF THE INVENTION

An object of the invention is to provide an improved method for bonding outer leads of a liquid crystal display panel to metal leads of bonding tape that uses backlighting of the leads.

Another object of the invention is to provide an improved apparatus for bonding the outer leads of a display panel to metal leads of bonding tape, wherein the alignment of the leads is facilitated by the use of a light source that backlights the leads.

In accordance with the afore-mentioned objects, there is provided an improved method of bonding outer leads of a display panel to metal leads of bonding tape wherein the display panel is mounted on a movable stage provided with a light source that is located beneath the outer leads. The bonding tape is positioned over the outer leads. The resultant overlapped leads are observed from above the light source and alignment. Heat is then applied to bond the outer leads and metal leads together.

In accordance with the afore-mentioned objects, there is provided an apparatus for bonding outer leads of a display panel to metal leads of a bonding tape that includes a movable stage for supporting the display panel. A light source is provided on the stage that is positioned beneath the outer leads of the panel, when mounted on the stage. A means is provided to support the bonding tape so that the metal leads are held in overlapping position over the outer leads. A means to observe the resultant overlapped leads is located over the light source. A heat source for applying heat to the aligned leads to form bonds therebetween is provided.

DESCRIPTION OF PREFERRED EMBODIMENTS

Figure 1:
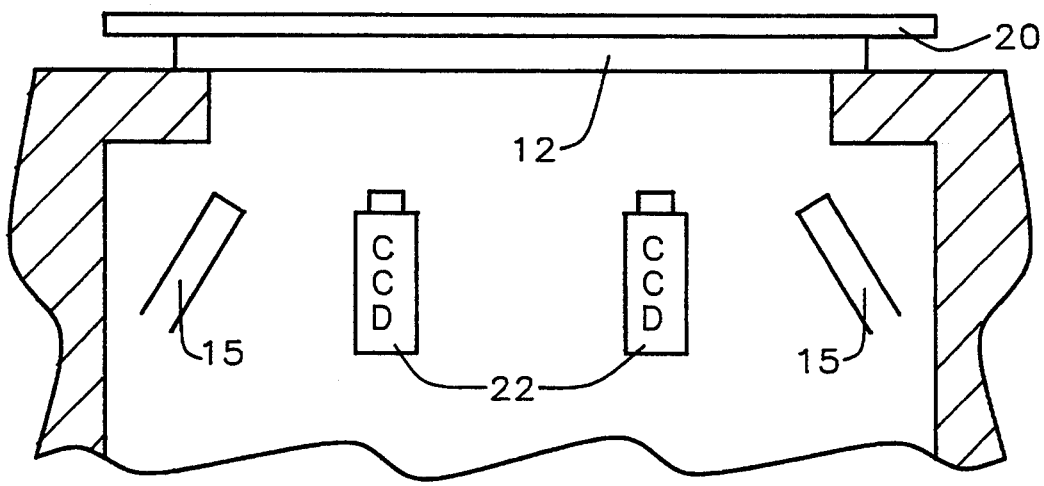
FIG. 1 is a schematic diagram of the Prior Art system for outer lead bonding for LCD panels.
Figure 2:
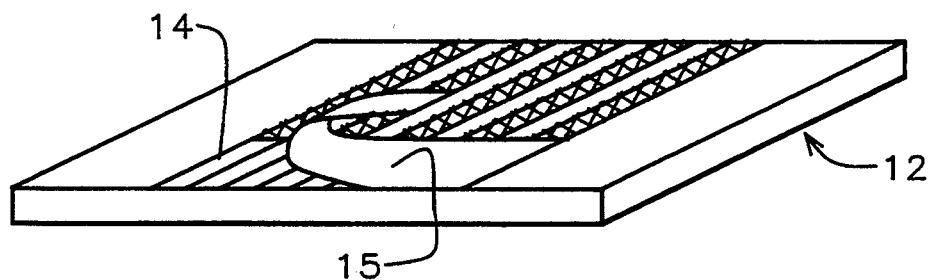
FIG. 2 is a perspective view of LCD panel illustrating the first step in the practice of the method of the invention.
Figure 3:
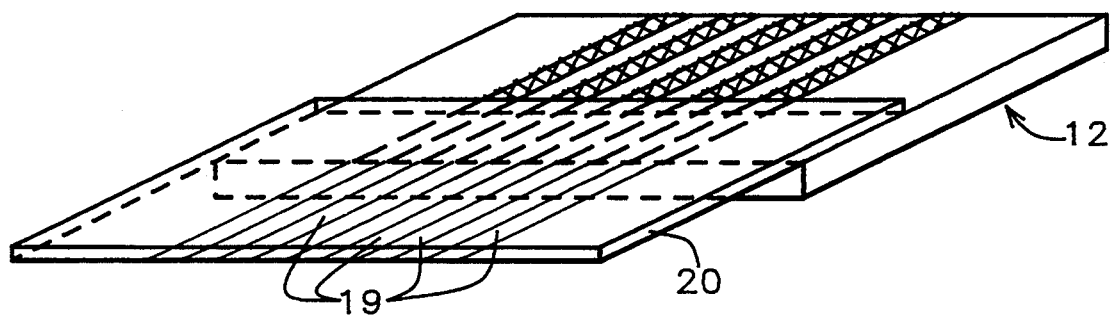
FIG. 3 is a perspective view of a LCD panel and a bonding tape that illustrates the second step in the practice of the method of the invention.
Figure 4:
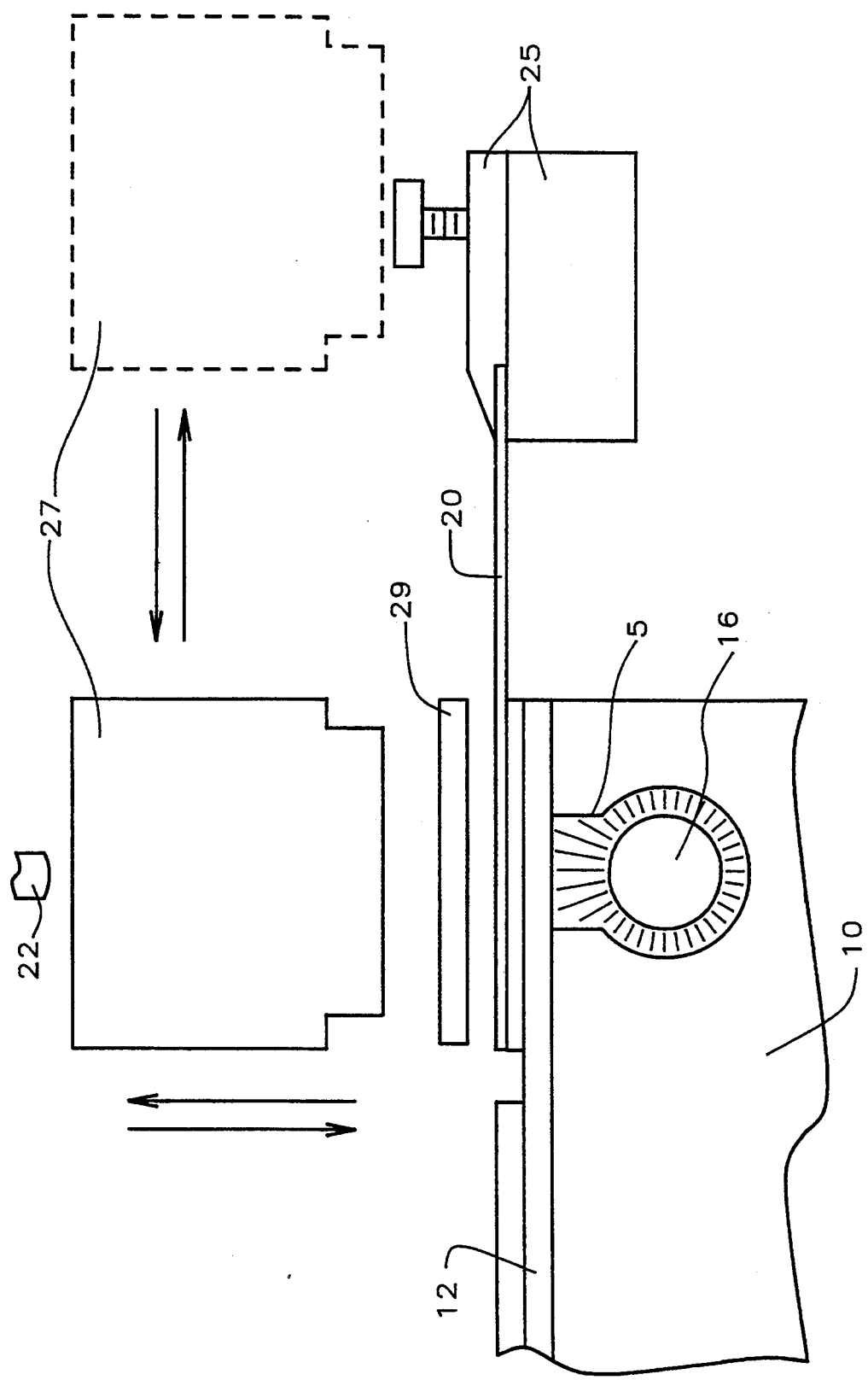
FIG. 4 is an illustration of the essential elements of the present and new apparatus for bonding outer leads of a LCD panel to metal leads of a bonding tape.

Referring now to FIG. 2, 3 and 4 there is illustrated a combination of elements used in the practice of the invention. A stage 10 is shown supporting a liquid crystal display (LCD) panel 12 which is composed of a bottom supporting glass and the LCD itself on the glass. LCD panels are well known in the art and will not be described, except to point out that along the edge, are provided a plurality of closely spaced outer leads 14, formed of a transparent or translucent electrically conductive material, usually indium tin oxide (ITO) or the like. The outer terminals 14, are shown more clearly in FIG. 2 and 3. The stage is movable so that it can be adjusted in the X, Y and Z directions, and also in an angular movement Θ (Theta). As shown in FIG. 4, a light source 16 is positioned in the stage 10 directly beneath outer terminals 14. The light can be a tube shaped light which can fit into the groove of a width about 5 to 10 millimeters or less. The preferred light is a cold cathode fluorescent light having a lamp diameter of between about 4 to 7 millimeters, lamp length of 130 to 260 millimeters, lamp current of between about 4 to 8 milliamps and luminance of between about 3500 to 15000 cd/square meters and made by Harison Electric Co. Alternatively, other optical light sources such as fiber lighting sources, etc. can be used. The light is positioned in a groove 5 in stage 10. Tape holder 25 is shown holding a bonding tape 20, provided with closely spaced metal leads 19, arranged in a pattern that corresponds to the pattern of outer leads 14. The other ends of the metal leads 19 of bonding tape 20, are bonded to circuitry on circuit board at a later time, using techniques known to the art. The tape holder 25 is movable in the X, Y, Z and Θ (theta) directions. The apparatus further includes a means to observe the resultant back lighted outer leads 14, and overlapping metal leads 19, such as a video camera 22 (which location is fixed in FIG. 4), or a coaxial microscope (not illustrated), so that the leads can be aligned with each other by moving one or both of the stages supporting the LCD panel 12 or tape 20 by means of tape holder 25. The camera 22 or coaxial microscope (not shown) is fixed. The camera or microscope is provided with a suitable monitor (not shown). A thermal heat source, such as thermode 27 is subsequently moved over the leads for bonding the leads together. An isolation layer 29 can be used to isolate the thermode from the bonding tape 20 during bonding operation.

The alignment of these outer leads to the tape is extremely critical. The problem is the difficulty in viewing the leads 14 and 19 for alignment. The LCD panel and glass substrate 12 are transparent, but the outer lead bonding tape 19, 20 is partially opaque. It is this opaqueness that causes the alignment visibility problem of the prior art. The heat source for bonding is preferably a thermal bonding tool which has a prebonding heating range of between about 60° to 100° C. and a main thermal bonding heating range in the order of about 150° to 170° C.

Figure 5:
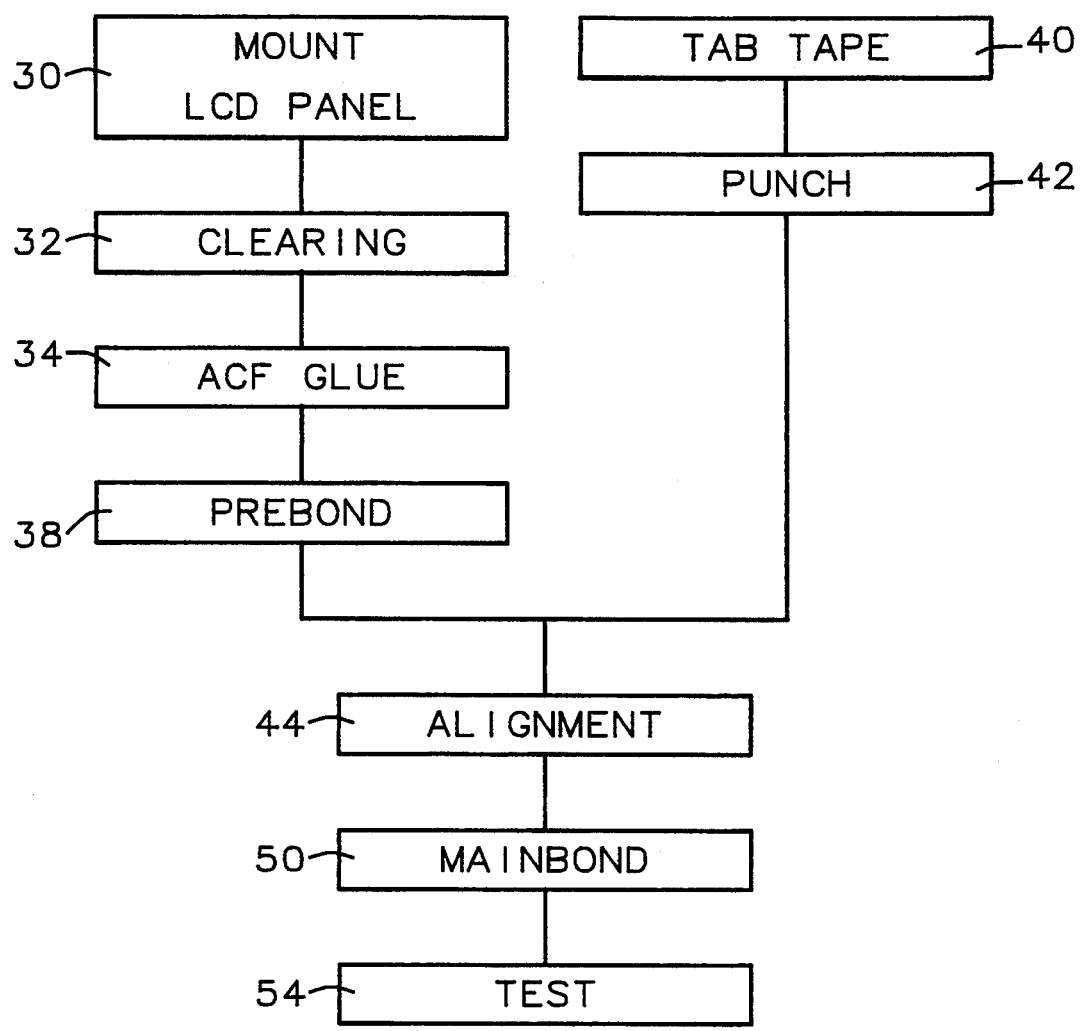
FIG. 5 is a flow chart that illustrates the method steps of a preferred specific embodiment of the method of the invention.

Referring now to FIG. 5, the method steps of the method of the invention are depicted. As illustrated, Block 30, a LCD panel is mounted on and secured to the stage 10. The panel can be secured by vacuum. The Block 32 indicates that the outer leads 14 are cleaned, as by a solvent such as acetone or by oxygen plasma in preparation for the bonding process.

Block 34 indicates that an anisotropic conductive film (ACF) adhesive is applied to the outer leads 14. This is achieved by applying the adhesive to a backing paper 15, and placing the paper over the outer leads. The back-up paper is then removed as seen in FIG. 2, leaving the adhesive on the leads.

As indicated by block 38, the leads 14 are prebonded by the thermal bonding tool 27. The tool 27 is movable to a position of bonding or out of position of bonding as seen in FIG. 4. The temperature range for prebonding is between about 60° to 100° C. and bonding time is between about 3 to 5 seconds. The purpose of prebonding is to make the ACF adhesive film which covers leads 14 in FIG. 2 (but is not physically shown because of its thinness and transparency) to adhere to these outer leads of the LCD panel temporarily so that the back paper 15 can be peeled off. The presence of the back paper is to prevent the ACF from being contaminated before using. The compositions of ACF are tiny conductive particles (about 3 to 10 microns) and an adhesive. The composition of the particles can be pure metal particles, such as solder or nickel or a polymer core coated by nickel or gold. This prebonding occurs using pressure as well as the heat indicated.

As indicated by Block 40, a reel of bonding tape 20 with closely spaced metal leads 19 is provided. The bonding tape 20 from the reel is punched or cut at block 42 to the desired and needed dimensions for the bonding process.

Block 44 indicates that the camera and monitor (not shown) with the help of the back lighted outer lead and tape automated bonding tape holder 25 is used to move the stage 10 supporting the LCD panel in the X, Y, Z and Θ (theta) directions to accurately align the leads 14 and 19 so that leads 19 exactly overlie leads 14. The backlighting of the metal leads of the tape as described by this new apparatus allows better and quicker alignment of the outer leads in preparation for the main thermal bonding step.

The Block 50 is the main bonding of leads 19 to leads 14 by applying heat in the temperature range of between about 150° to 170° C. and for a bonding time of between about 20 to 35 seconds depending on the composition of the ACF adhesive. With this high heat the polymer of the ACF is cured with its conductive particles therein to form a conductive film between the leads 14 and 19. After this main thermal bonding, the bonding interface is stiff and provides the reliability of interface of outer leads of the LCD panel and metal leads of the tape.

The block 54 indicates that the bonded structure is now tested as is known in the art to see if the structure is physically and electrically functional.

An isolation layer 29 can be used as seen in FIG. 4. The layer 29 can be silicon rubber or as we prefer an aluminium foil coated with a thin layer of polyimide of about 75 microns in thickness. The function of the layer 29 has two advantages. One is to act as a compensator between the thermode and the LCD panel such that the pressure is uniformly distributed during bonding. The other is to prevent the adhesive from contaminating the thermode. During main bonding steps, the adhesive will flow out, because of the pressure. The adhesive will not only adhere to the LCD panel and the metal leads of the tape interface but also the thermode and the LCD panel.

The temperature of the thermode and bonding interface are different. In order to check the actual differences, we can mount thermocouples between the outer leads of the LCD panel and the metal leads of the tape.

A printed circuit board (not shown) is joined by conventional methods to the LCD panel 12 by means of leads 14. The printed circuit board will carry the integrated circuit chips needed for the LCD panel operation. This does not form a part of the present invention and is not illustrated.

While the invention has been particularly shown and described with reference to the preferred embodiments thereof, it will be understood by those skilled in the art, that various changes in form and details may be made without departing from the spirit and scope of the invention.

What is claimed is:

1. A method of aligning and bonding the closely spaced translucent electrically conductive outer leads of a Liquid Crystal Display panel to closely spaced metal leads of a bonding tape comprising:
    mounting the display panel on a movable stage;
    providing a light source beneath the outer leads of the display panel to provide back lighting;
    applying an anisotropic conductive film adhesive to the outer leads of the display panel;
    mounting the metal leads of the bonding tape over the outer leads of the display panel;
    observing the back lighted outer leads and the overlapping metal leads from above said light source and aligning the outer leads to precisely underlie the metal leads by adjusting the relative positions of the display panel and the bonding tape; and
    applying heat to the outer leads and the metal leads to bond and form electrical connections therebetween.

2. The method of claim 1, wherein said bonding tape is supported by a tape holder during said method.

3. The method of claim 1, wherein said adhesive applied to said outer leads is prebonded by the application of heat.

4. The method of claim 3, wherein said adhesive is applied by use of a paper backed adhesive wherein the paper is removed after the adhesive has adhered to the desired surfaces.

5. The method of claim 1, wherein said observation of the outer leads and overlapping metal leads is achieved with a video camera mounted over said light source and a monitor.

6. The method of claim 1, wherein said observation of the outer leads and overlapping metal leads is achieved with a microscope mounted over the light source.

7. The method of claim 1, wherein following the bonding of the outer leads to the metal leads, the resultant electrical connections are tested.

8. An apparatus to bond closely spaced translucent electrically conductive outer leads of a Liquid Crystal Display panel to closely spaced metal leads of a bonding tape comprising;
- a stage to support said display panel provided with a means to move the stage in the X, Y, Z and theta (angular) directions;
- a means to secure said display panel to said stage;
- a light source on said stage that is located within a narrow groove in said stage beneath the outer leads of a display panel mounted on said stage;
- a means to support a bonding tape in close proximity to said stage so that the metal leads are positioned in overlapping relation to said outer leads;
- a means to observe the resultant back lighted outer leads and overlapping metal leads from a position above said light source;
- a means to adjust the relative position of said outer leads and said metal leads to achieve alignment thereof; and
- a heat source to bond the resultant aligned outer leads and metal leads.

9. The apparatus of claim 8, wherein said means to secure said display panel to said stage is a vacuum source.

10. The apparatus of claim 8, wherein said means to support a bonding tape is supported by a tape holder structure.

11. The apparatus of claim 8, wherein said means to observe the outer leads and metal leads is a video camera permanently mounted above said light source, and a monitor.

12. The apparatus of claim 8, wherein said means to observe the outer leads and metal leads is a microscope mounted above said light source.

13. The apparatus of claim 11, which further includes a mounting means for said heat source, which permits moving said heat source into and out of position over said light source and to permit movement of said heat source to an operative position over said outer leads and metal leads.

14. The apparatus of claim 8, wherein said heat source is a hot bar thermode.

15. The apparatus of claim 8 wherein said groove is less than about 10 millimeters in width.

16. The apparatus of claim 15 wherein said groove is between about 5 and 10 millimeters in width.

17. The apparatus of claim 16 wherein said light source is a cold cathode fluorescent light having a luminance of between about 3500 to 15000 cd per square millimeters.

18. The apparatus of claim 16 wherein said light source is a fiber optical light source having a luminance of between about 3500 to 15000 cd per square millimeters.

* * * * *